United States Patent
Lin et al.

(10) Patent No.: US 9,659,893 B2
(45) Date of Patent: May 23, 2017

(54) SEMICONDUCTOR PACKAGE

(71) Applicant: MediaTek Inc., Hsin-Chu (TW)

(72) Inventors: Tzu-Hung Lin, Zhubei (TW);
Ching-Liou Huang, Qionglin Township, Hsinchu County (TW);
Thomas Matthew Gregorich, San Diego, CA (US)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/826,471

(22) Filed: Aug. 14, 2015

(65) Prior Publication Data
US 2015/0357291 A1 Dec. 10, 2015

Related U.S. Application Data

(63) Continuation-in-part of application No. 14/103,066, filed on Dec. 11, 2013, now Pat. No. 9,142,526, which is a continuation of application No. 13/332,658, filed on Dec. 21, 2011, now Pat. No. 8,633,588.

(51) Int. Cl.
*H01L 23/00* (2006.01)
*H01L 23/498* (2006.01)
*H01L 21/56* (2006.01)
*H01L 23/31* (2006.01)
*H01L 23/50* (2006.01)

(52) U.S. Cl.
CPC ............ *H01L 24/17* (2013.01); *H01L 21/563* (2013.01); *H01L 23/3142* (2013.01); *H01L 23/49838* (2013.01); *H01L 23/49894* (2013.01); *H01L 23/562* (2013.01); *H01L 24/16* (2013.01); *H01L 24/32* (2013.01); *H01L 23/3114* (2013.01); *H01L 23/50* (2013.01); *H01L 24/13* (2013.01); *H01L 2224/131* (2013.01); *H01L 2224/16225* (2013.01); *H01L 2224/16238* (2013.01); *H01L 2224/26175* (2013.01); *H01L 2224/2919* (2013.01); *H01L 2224/32225* (2013.01); *H01L 2224/73204* (2013.01); *H01L 2224/81193* (2013.01); *H01L 2224/81815* (2013.01); *H01L 2224/83102* (2013.01); *H01L 2224/83855* (2013.01); *H01L 2924/181* (2013.01); *H01L 2924/183* (2013.01); *H01L 2924/1811* (2013.01); *H01L 2924/35* (2013.01)

(58) Field of Classification Search
CPC .............................. H01L 23/562; H01L 24/38
See application file for complete search history.

(56) References Cited

U.S. PATENT DOCUMENTS 5,925,931 A 7/1999 Yamamoto
6,061,248 A 5/2000 Otani et al.
(Continued)

*Primary Examiner* — Matthew Landau
*Assistant Examiner* — Grant Withers
(74) *Attorney, Agent, or Firm* — McClure, Qualey & Rodack, LLP

(57) ABSTRACT

The invention provides a semiconductor package. The semiconductor package includes a substrate. A first conductive trace is disposed on the substrate. A first conductive trace disposed on the substrate. A semiconductor die is disposed over the first conductive trace. A solder resist layer that extends across an edge of the semiconductor die is also included. Finally, a molding compound is provided that is formed over the substrate and covers the first conductive trace and the semiconductor die.

20 Claims, 4 Drawing Sheets

(56) References Cited

U.S. PATENT DOCUMENTS

| | | |
|---|---|---|
| 6,297,553 B1 | 10/2001 | Horiuchi et al. |
| 6,855,573 B2 | 2/2005 | Li et al. |
| RE39,603 E | 5/2007 | Kata et al |
| 7,319,276 B2 | 1/2008 | Hsu et al. |
| 7,388,281 B2 | 6/2008 | Krueger et al. |
| 7,474,006 B2 | 1/2009 | Maeda |
| 7,508,073 B2 | 3/2009 | Nakamura et al. |
| 7,569,935 B1 | 8/2009 | Fan |
| 7,932,615 B2 | 4/2011 | Rinne |
| 8,222,738 B2 | 7/2012 | Ota et al. |
| 8,513,818 B2 | 8/2013 | Hagihara |
| 8,633,598 B1 * | 1/2014 | St. Amand .......... H01L 21/4853 257/778 |
| 2003/0134455 A1 | 7/2003 | Cheng et al. |
| 2004/0113285 A1 | 6/2004 | Tay et al. |
| 2005/0070084 A1 | 3/2005 | Hsu et al. |
| 2006/0157845 A1 | 7/2006 | Terui |
| 2006/0278999 A1 | 12/2006 | Hsu et al. |
| 2007/0096337 A1 | 5/2007 | Choi |
| 2007/0187824 A1 | 8/2007 | Anzai |
| 2008/0067661 A1 | 3/2008 | Kawabata |
| 2008/0088016 A1 | 4/2008 | Ho et al. |
| 2009/0184419 A1 | 7/2009 | Pendse |
| 2009/0250811 A1 | 10/2009 | Pendse |
| 2009/0302463 A1 | 12/2009 | Gallegos et al. |
| 2010/0007015 A1 | 1/2010 | Gallegos |
| 2010/0148332 A1 * | 6/2010 | Kajiki ................... H01L 21/565 257/678 |
| 2011/0049703 A1 * | 3/2011 | Hsu ................... H01L 23/49811 257/737 |
| 2011/0074008 A1 | 3/2011 | Hsieh |
| 2011/0133334 A1 | 6/2011 | Pendse |
| 2011/0186986 A1 | 8/2011 | Chuang et al. |
| 2011/0198753 A1 | 8/2011 | Holland |
| 2011/0204511 A1 | 8/2011 | Beddingfield et al. |
| 2011/0241203 A1 | 10/2011 | Nakasato et al. |
| 2011/0248399 A1 | 10/2011 | Pendse |
| 2011/0272799 A1 | 11/2011 | Huang |
| 2011/0278723 A1 | 11/2011 | Nishimura et al. |
| 2011/0285013 A1 | 11/2011 | Chuang et al. |
| 2011/0300672 A1 | 12/2011 | Ota et al. |
| 2011/0309500 A1 | 12/2011 | Pendse |
| 2012/0007232 A1 | 1/2012 | Haba |
| 2012/0025373 A1 | 2/2012 | Pagaila et al. |
| 2012/0032322 A1 | 2/2012 | Lin et al. |
| 2012/0032343 A1 | 2/2012 | Lin et al. |
| 2012/0056321 A1 | 3/2012 | Pagaila |
| 2012/0126399 A1 | 5/2012 | Lin et al. |
| 2012/0133042 A1 | 5/2012 | Hayashi et al. |
| 2012/0153463 A1 | 6/2012 | Maeda |
| 2012/0199972 A1 | 8/2012 | Pagaila et al. |
| 2012/0241945 A9 | 9/2012 | Pendse |
| 2012/0241946 A9 | 9/2012 | Pendse |
| 2012/0267778 A1 | 10/2012 | Asami |
| 2012/0273941 A1 | 11/2012 | Zeng |
| 2012/0273943 A1 | 11/2012 | Pendse et al. |
| 2012/0292760 A1 | 11/2012 | Narita et al. |
| 2012/0292761 A1 | 11/2012 | Yang et al. |
| 2012/0313240 A1 | 12/2012 | Cheng et al. |
| 2012/0313243 A1 | 12/2012 | Chang et al. |
| 2012/0319272 A1 | 12/2012 | Pendse |
| 2012/0319273 A1 | 12/2012 | Pendse |
| 2013/0026621 A1 | 1/2013 | Tsai et al. |
| 2013/0026628 A1 | 1/2013 | Pendse |

* cited by examiner

US 9,659,893 B2

SEMICONDUCTOR PACKAGE

CROSS REFERENCE TO RELATED APPLICATIONS

This application is a Continuation-In-Part of U.S. patent application Ser. No. 14/103,066, filed on Dec. 11, 2013, which is a Continuation of U.S. patent application Ser. No. 13/332,658, filed on Dec. 21, 2011, now U.S. Pat. No. 8,633,588, issued on Jan. 21, 2014. The entireties of which are incorporated by reference herein.

BACKGROUND OF THE INVENTION

Field of the Invention

The present invention relates to a semiconductor package, and in particular, to a solder resist layer design of a flip chip package.

Description of the Related Art

For the conventional flip chip package, it is well known that the underfill protects the conductive bumps by considerably reducing the stress to the conductive bumps. However, the underfill itself is subject to shear or peeling stress and consequently, may induce failure modes. For instance, an imperfect underfill with voids or microcracks will produce cracks or delamination under temperature cycling conditions.

Delamination at bimaterial interfaces such as the underfill and conductive traces, driven by coefficient of thermal expansion (CTE) mismatching between organic underfills and inorganic conductive traces, is one of failure modes. Once the underfill delamination, occurs, failure usually results from conductive bump fatigue cracks because of the loss of the underfill protection and stress concentration arising from the underfill delamination.

Thus, a novel flip chip package without the underfill delamination is desirable.

BRIEF SUMMARY OF INVENTION

A semiconductor package is provided. An exemplary embodiment of a semiconductor package includes a substrate. A first conductive trace is disposed on the substrate. A solder resist layer is disposed on the substrate, having an extending portion covering a portion of the first conductive trace, wherein a width of the extending portion of the solder resist layer is larger than that of the portion of the first conductive trace. A semiconductor die is disposed over the first conductive trace.

Another exemplary embodiment of a semiconductor package includes a substrate. A first conductive trace is disposed on the substrate. A solder resist layer is disposed on the substrate, having an extending portion covering a portion of the first conductive trace, wherein the extending portion of the solder resist layer has a vertical sidewall extruding over to an adjacent vertical sidewall of the portion of the first conductive trace. A semiconductor die is disposed over the first conductive trace.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
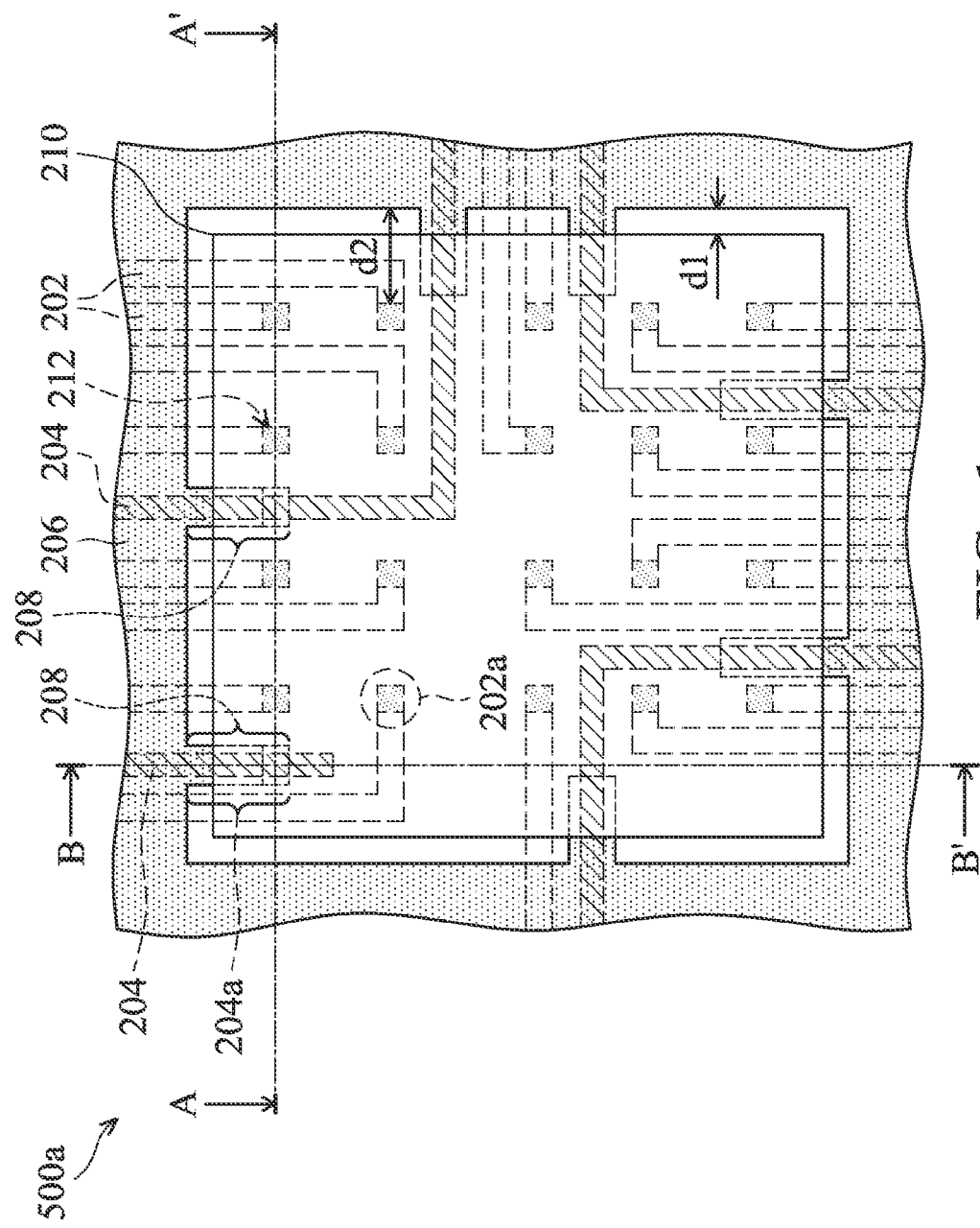
FIG. 1 shows a top view of one exemplary embodiment of a semiconductor package of the invention.

The following description is a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

Figure 2:
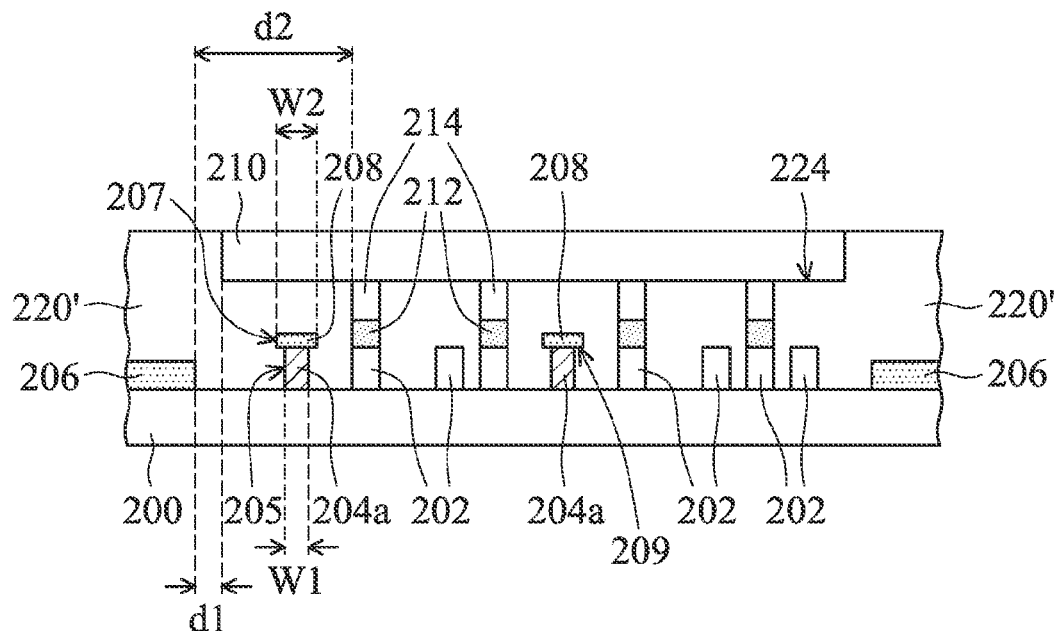
FIG. 2 shows a cross section along line A-A' of FIG. 1.
Figure 3:
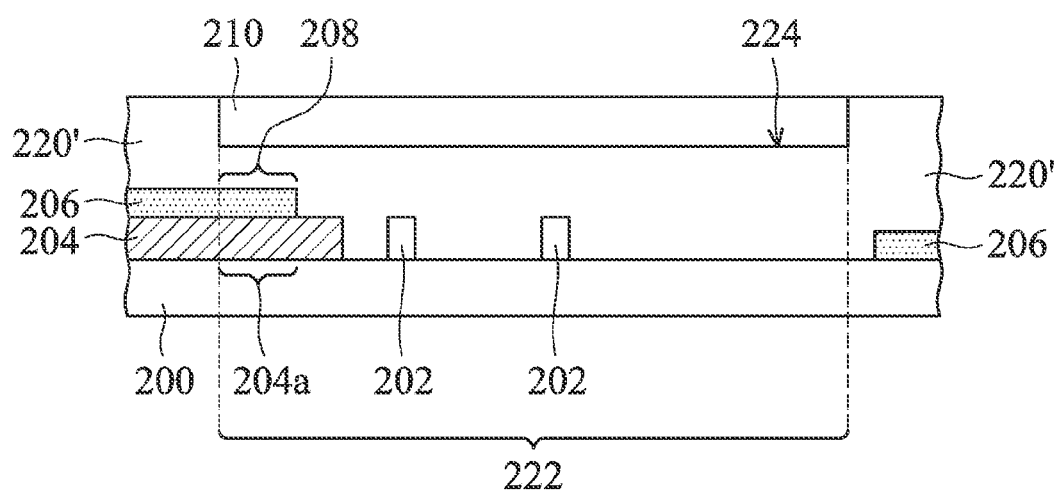
FIG. 3 shows a cross section along line B-B' of FIG. 1.

FIG. 1 shows a top view of one exemplary embodiment of a semiconductor package 500a of the invention. FIG. 2 shows a cross section along line A-A' of FIG. 1. FIG. 3 shows a cross section along line B-B' of FIG. 1. One exemplary embodiment of a semiconductor package 500a is a flip chip package using copper pillars connecting a semiconductor die and a substrate. As shown in FIGS. 1-3, one exemplary embodiment of a semiconductor package 500a comprises a substrate 200 with first conductive traces 204 and second conductive traces 202 disposed thereon. In one embodiment, the substrate 200 may be formed of by semiconductor materials such as silicon, or organic materials such as bismaleimide triacine, (BT), polyimide or ajinomoto build-up film (ABF). In one embodiment, the first conductive trace 204 and the second conductive trace 202 may comprise signal traces or ground traces, which are used for input/output (I/O) connections of a semiconductor die 210 mounted directly onto the substrate 200. In this embodiment, each of the first conductive traces 204 serves as a signal/ground trace segment for routing, and each of the second conductive traces 202 has a portion 202a as a pad region of the substrate 200.

Next, still referring to FIGS. 1-3, a solder resist layer 206 is conformably formed covering the substrate 200 by a deposition method and then the solder resist layer 206 is subjected to a patterning process. After the patterning process, the solder resist layer 206, except for extending portions 208, exposes an overlapping region between a subsequently mounted semiconductor die 210 and the substrate 200. It is noted that the extending portions 208 of the solder resist layer 206 extends along the first conductive trace 204 and covering a portion of the first conductive trace 204. Also, the solder resist layer 206, except for extending portions 208, is disposed away from the subsequently mounted semiconductor die 210 by a distance d1. In one embodiment, the solder resist layer 206 may comprise solder mask materials, oxide, nitride, or oxynitride. As shown in FIG. 2, the extending portions 208 of the solder resist layer 206 covers a portion 204a of the first conductive trace 204.

It is noted that a width W2 of the extending portion 208 of the solder resist layer 206 is designed to be larger than a width W1 of the portion 204a of the first conductive trace 204, so that a portion of a bottom surface 209 of the extending portion 208 of the solder resist layer 206 is exposed from the 204a of the first conductive trace 204, and the extending portion 208 of the solder resist layer 206 has a vertical sidewall 207 extruding over to an adjacent vertical sidewall 205 of the portion 204a of the first conductive trace 204. Therefore, the extending portion 208 and the portion 204a of the first conductive trace 204 collectively have a T-shaped cross section.

Next, a dry film photoresist or a liquid photoresist (not shown) is entirely laminated on the substrate 200. Next, the dry film photoresist/liquid photoresist is patterned by a photolithography process comprising an exposure step and a development step to form openings (not shown) respectively over the portions (pad regions) 202a of the second conductive traces 202, so that formation positions of a subsequently formed conductive pillar may be defined.

Then, the conductive pillars 212 are respectively formed on the portions (pad regions) 202a of the second conductive traces 202, filling the openings of the dry film photoresist/liquid photoresist. Alternatively, conductive buffer layers (not shown) formed of Ni may be formed between the conductive pillars 212 and the portions (pad regions) 202a of the second conductive traces 202, and the conductive buffer layers may serve as seed layers, adhesion layers and barrier layers for the conductive pillars 212 formed thereon. In one embodiment, the conductive pillars 212 are used as a solder joint for a subsequently formed conductive bump, which transmits input/output (I/O), ground or power signals of the semiconductor die 210, formed thereon. Therefore, the conductive pillars 212 may help to increase the mechanical strength of the bump structure. In one embodiment, the conductive pillars 212 may be formed of copper. Next, the dry film photoresist/liquid photoresist is removed by a stripping process such as a wet etching process using a suitable etchant.

Next, still referring to FIGS. 1-3, the semiconductor die 210 has a plurality of conductive bumps 214 formed on bond pads (not shown) of the semiconductor die 210 mounted on the substrate 200. The conductive bumps 214 respectively connect to the portions (pad regions) 202a of the second conductive traces 202 through the conductive pillars 212 therebetween. As shown in FIG. 1, the solder resist layer 206 is disposed away from the portions (pad regions) 202a of the second conductive traces 202, which overlap with the conductive pillars 212, by at least a distance d2. As shown in FIG. 3, the extending portion 208 of the solder resist layer 206 is below the semiconductor die 210, over a bottom surface 224 of the semiconductor die 210 and within a projection area 222 of the semiconductor die 210.

Next, referring to FIGS. 2-3, a molding compound 220' may be formed over the substrate 200 and cover the semiconductor die 210, the first and second conductive traces 204 and 202, and the solder resist layer 206, and flow to fill a gap between the substrate 200 and the semiconductor die 210 to compensate for differing coefficients of thermal expansion (CTE) between the substrate, the conductive traces and the semiconductor die. The molding compound 220' is then cured. In one embodiment of the invention, the portion of the bottom surface 209 of the extending portion 208 of the solder resist layer 206 is wrapped by the molding compound 220'. After the aforementioned processes, one exemplary embodiment of a semiconductor package 500a is completely formed.

Figure 4:
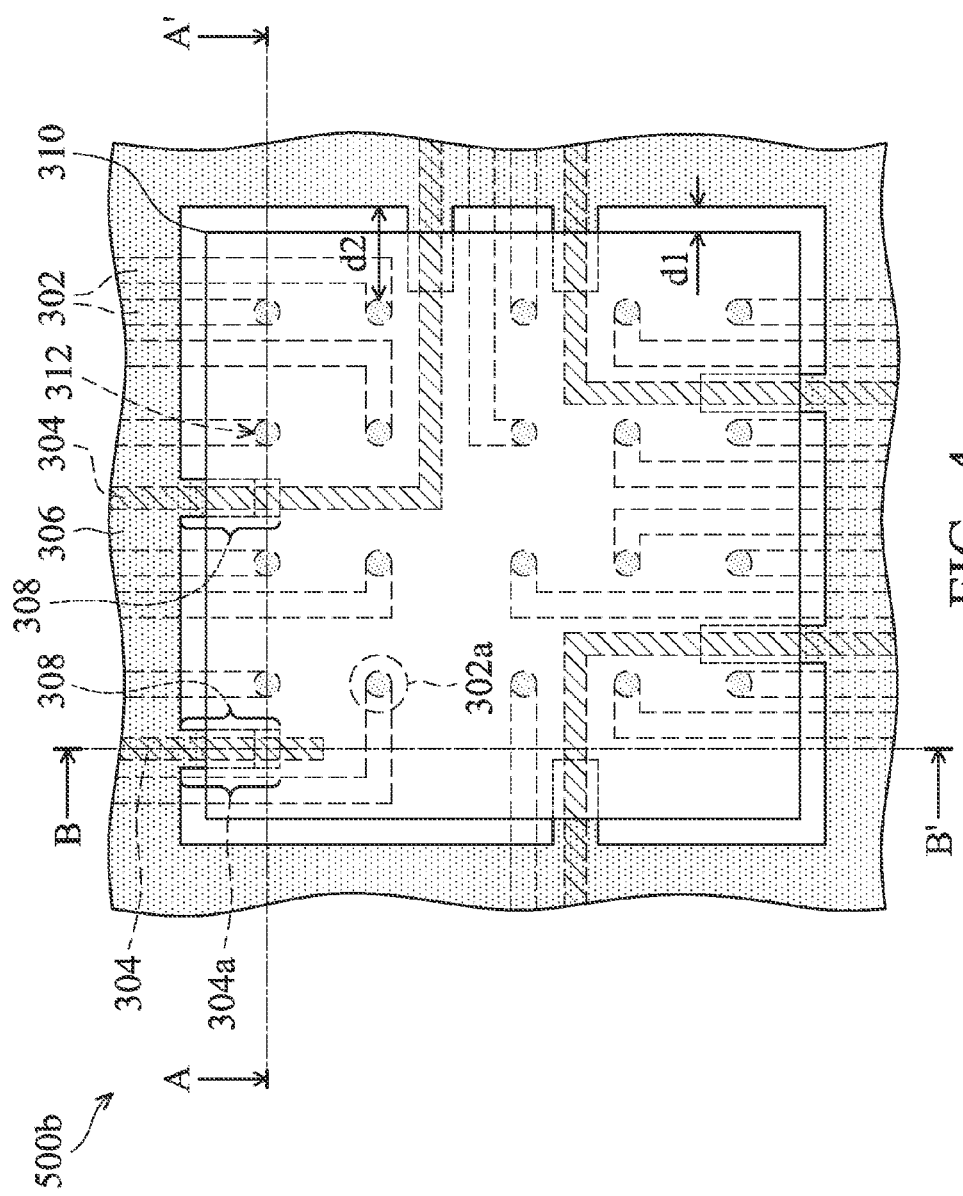
FIG. 4 shows a top view of another exemplary embodiment of a semiconductor package of the invention.
Figure 5:
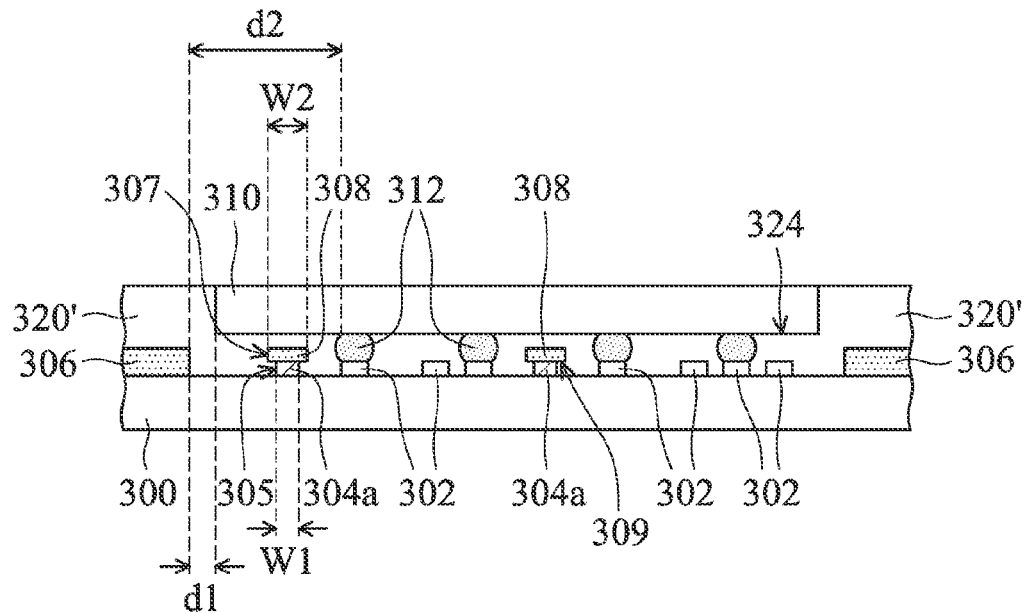
FIG. 5 shows a cross section along line A-A' of FIG. 4.
Figure 6:
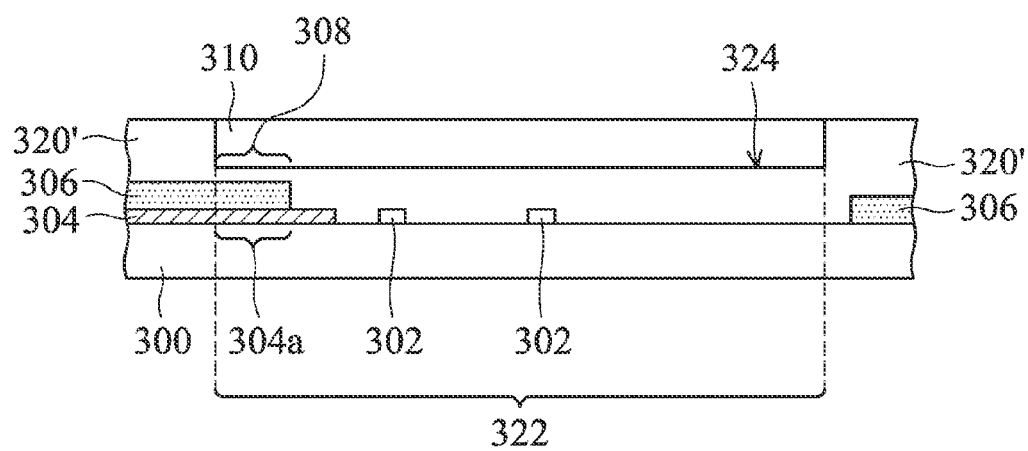
FIG. 6 shows a cross section along line B-B' of FIG. 4.

FIG. 4 shows a top view of one exemplary embodiment of a semiconductor package 500b of the invention. FIG. 5 shows a cross section along line A-A' of FIG. 4. FIG. 6 shows a cross section along line B-B' of FIG. 4. One exemplary embodiment of a semiconductor package 500b is a flip chip package using solder bumps but not copper pillars for a connection between a semiconductor die and a substrate. As shown in FIGS. 4-6, one exemplary embodiment of a semiconductor package 500b comprises a substrate 300 with first conductive traces 304 and second conductive traces 302 disposed thereon. In one embodiment, the substrate 300 may be formed of by semiconductor materials such as silicon, or organic materials such as bismaleimide triacine, (BT), polyimide or ajinomoto build-up film (ABF). In one embodiment, the first conductive trace 304 and the second conductive trace 302 may comprise signal traces or ground traces, which are used for input/output (I/O) connections of a semiconductor die 310 mounted directly onto the substrate 300. In this embodiment, each of the first conductive traces 304 serves as a signal/ground trace segment for routing, and each of the second conductive traces 302 has a portion 302a as a pad region of the substrate 300.

Next, still referring to FIGS. 4-6, a solder resist layer 306 is conformably formed covering the substrate 300 by a deposition method and then the solder resist layer 306 is subjected to a patterning process. After the patterning process, the solder resist layer 306, except for extending portions 308, exposes an overlapping region between a subsequently mounted semiconductor die 310 and the substrate 300. It is noted that the extending portions 308 of the solder resist layer 306 extends along the first conductive trace 304 and covering a portion of the first conductive trace 304. Also, the solder resist layer 306, except for extending portions 308, is disposed away from the subsequently mounted semiconductor die 310 by a distance d1. In one embodiment, the solder resist layer 306 may comprise solder mask materials, oxide, nitride, or oxynitride. As shown in FIG. 5, the extending portions 308 of the solder resist layer 306 covers a portion 304a of the first conductive trace 304. It is noted that a width W2 of the extending portion 308 of the solder resist layer 306 is designed to be larger than a width W1 of the portion 304a of the first conductive trace 304, so that a portion of a bottom surface 309 of the extending portion 308 of the solder resist layer 306 is exposed from the 304a of the first conductive trace 304, and the extending portion 308 of the solder resist layer 306 has a vertical sidewall 307 extruding over to an adjacent vertical sidewall 305 of the portion 304a of the first conductive trace 304. Therefore, the extending portion 308 and the portion 304a of the first conductive trace 304 collectively have a T-shaped cross section.

Next, referring to FIGS. 4-6, a solder printing process is performed to form solder paste patterns (not shown) on the portions (pad regions) 302a of the second conductive traces 302. Next, a semiconductor die 310 having a plurality bond pads (not shown) is mounted on the substrate 300. Bond pads (not shown) of the semiconductor die 310 respectively connect the solder paste patterns. Next, a reflow process and a cooling process are performed in sequence, so that the solder paste patterns are transformed into solder bumps 312 connecting the portions (pad regions) 302a of the second conductive traces 302 of the substrate 300 and the bond pads (not shown) of the semiconductor die 310. As shown in FIG. 4, the solder resist layer 306 is disposed away from the portions (pad regions) 302a of the second conductive traces 302, which overlap with the solder bumps 312, by at least a distance d2. As shown in FIG. 6, the extending portion 308 of the solder resist layer 306 is below the semiconductor die 310, over a bottom surface 324 of the semiconductor die 310 and within a projection area 322 of the semiconductor die 310.

Next, referring to FIGS. 5-6, a molding compound 320' may be formed over the substrate 300 and cover the semiconductor die 210, the first and second conductive traces 204 and 202, and the solder resist layer 206, and flow to fill a gap between the substrate 300 and the semiconductor die 310 to compensate for differing coefficients of thermal expansion (CTE) between the substrate, the conductive traces and the semiconductor die. The molding compound 320' is then cured. In one embodiment of the invention, the portion of the bottom surface 309 of the extending portion 308 of the solder resist layer 306 is wrapped by the molding compound 320'. After the aforementioned processes, another exemplary embodiment of a semiconductor package 500b is completely formed.

Some advantages of exemplary embodiments of a semiconductor package 500a and 500b of the invention are described in the following. The molding compound wraps the portion of the bottom surface of the extending portion of the solder resist layer, which has a wider width than the portion of the first conductive trace, so that the molding compound may be anchored with a T-shaped feature formed by both the extending portion of the solder resist layer and the portion of the first conductive trace. Thus, the conventional underfill delamination problem occurring between the conductive trace and the underfill material is improved. Also, the extending portion of the solder resist layer only extends into a projection area of the die to cover a portion of the first conductive trace, and the remaining portion of the solder resist layer is disposed away from the semiconductor die by a distance, so that the semiconductor package still has enough space to allow the molding compound to flow to fill the gap between the substrate and the semiconductor die. Therefore, the extending portion of the solder resist layer does not affect the formation of the molding compound. Moreover, exemplary embodiments of a semiconductor package can be used in many types of package methods. For example, a gap between the substrate and the semiconductor die can be filled with a molding compound only. Alternatively, the gap between the substrate and the semiconductor die can be filled with a molding compound and an underfill material. Further, the gap between the substrate and the semiconductor die can be filled with an underfill material only.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
a substrate;
a first conductive trace disposed on the substrate;
a semiconductor die disposed above the substrate;
a solder resist layer, wherein a portion of the solder resist layer extends across an edge of the semiconductor die; and
a molding compound formed over the substrate, covering a portion of the first conductive trace, and extending between a bottom surface of the semiconductor die and the portion of the first conductive trace, wherein the entirety of the portion of the first conductive trace is directly below the semiconductor die;
wherein, from a top view, a plurality of strips of the solder resist layer extend from outside an edge of the semiconductor die to a region between the semiconductor die and the substrate.

2. The semiconductor package as claimed in claim 1, wherein the portion of the solder resist layer covers the portion of the first conductive trace, and wherein a width of the portion of the solder resist layer is larger than that of the portion of the first conductive trace from a top view.

3. The semiconductor package as claimed in claim 1, wherein the portion of the solder resist layer is below the semiconductor die and within a projection area of the semiconductor die.

4. The semiconductor package as claimed in claim 1, wherein the portion of the solder resist layer has a vertical sidewall extruding over an adjacent vertical sidewall of the portion of the first conductive trace from a top view.

5. The semiconductor package as claimed in claim 1, wherein the portion of the solder resist layer extends along the first conductive trace and over the bottom surface of the semiconductor die.

6. The semiconductor package as claimed in claim 1, wherein the portion of the solder resist layer extends from outside an edge of the semiconductor die to a region between the semiconductor die and the substrate.

7. The semiconductor package as claimed in claim 1, wherein the portion of the solder resist layer is covered by the molding compound.

8. A semiconductor package, comprising:
a substrate;
a first conductive trace disposed on the substrate;
a semiconductor die disposed above the substrate;
a solder resist layer, wherein a portion of the solder resist layer extends from outside an edge of the semiconductor die to a region between the semiconductor die and the substrate; and
a molding compound formed over the substrate, covering a portion of the first conductive trace, and extending between a bottom surface of the semiconductor die and the portion of the first conductive trace, wherein the entirety of the portion of the first conductive trace is directly below the semiconductor die;
wherein, from a top view, a plurality of strips of the solder resist layer extend from outside an edge of the semiconductor die to a region between the semiconductor die and the substrate.

9. The semiconductor package as claimed in claim 8, wherein the portion of the solder resist layer covers the portion of the first conductive trace, and wherein a width of the portion of the solder resist layer is larger than that of the portion of the first conductive trace from a top view.

10. The semiconductor package as claimed in claim 8, wherein the portion of the solder resist layer extends across an edge of the semiconductor die.

11. The semiconductor package as claimed in claim 8, wherein the portion of the solder resist layer is covered by the molding compound.

12. A semiconductor package, comprising:
a substrate;
a first conductive trace disposed on the substrate;
a semiconductor die disposed above the substrate;
a molding compound formed over the substrate, covering a portion of the first conductive trace, and extending between a bottom surface of the semiconductor die and the portion of the first conductive trace, wherein the entirety of the portion of the first conductive trace is directly below the semiconductor die; and a solder resist layer, wherein a portion of the solder resist layer is covered by the molding compound;

wherein, from a top view, a plurality of strips of the solder resist layer extend from outside an edge of the semiconductor die to a region between the semiconductor die and the substrate.

13. The semiconductor package as claimed in claim 12, wherein the portion of the solder resist layer covers the portion of the first conductive trace, and wherein a width of the portion of the solder resist layer is larger than that of the portion of the first conductive trace from a top view.

14. The semiconductor package as claimed in claim 12, wherein the portion of the solder resist layer extends across an edge of the semiconductor die.

15. The semiconductor package as claimed in claim 12, wherein the portion of the solder resist layer extends from outside an edge of the semiconductor die to a region between the semiconductor die and the substrate.

16. A semiconductor package, comprising:
a substrate;
a first conductive trace disposed on the substrate;
a semiconductor die;
a solder resist layer, wherein, from a top view, a plurality of strips of the solder resist layer extend from outside an edge of the semiconductor die to a region between the semiconductor die and the substrate; and a molding compound formed over the substrate, covering a portion of the first conductive trace, and extending between a bottom surface of the semiconductor die and the portion of the first conductive trace, wherein the entirety of the portion of the first conductive trace is directly below the semiconductor die.

17. The semiconductor package as claimed in claim 16, wherein a portion of the solder resist layer covers the portion of the first conductive trace, and wherein a width of the portion of the solder resist layer is larger than that of the portion of the first conductive trace from a top view.

18. The semiconductor package as claimed in claim 17, wherein the portion of the solder resist layer extends across an edge of the semiconductor die.

19. The semiconductor package as claimed in claim 17, wherein the portion of the solder resist layer extends from outside an edge of the semiconductor die to a region between the semiconductor die and the substrate.

20. The semiconductor package as claimed in claim 17, wherein the portion of the solder resist layer is covered by the molding compound.

* * * * *